US010401410B2

(12) United States Patent
Misumi

(10) Patent No.: US 10,401,410 B2
(45) Date of Patent: Sep. 3, 2019

(54) ELECTRIC ARC DETECTION APPARATUS AND ELECTRIC ARC DETECTION METHOD

(71) Applicant: OMRON Corporation, Kyoto-shi, Kyoto (JP)

(72) Inventor: Shuichi Misumi, Kyoto (JP)

(73) Assignee: OMRON Corporation, Kyoto-shi (JP)

( * ) Notice: Subject to any disclaimer, the term of this patent is extended or adjusted under 35 U.S.C. 154(b) by 174 days.

(21) Appl. No.: 15/680,641

(22) Filed: Aug. 18, 2017

(65) Prior Publication Data

US 2017/0343596 A1 Nov. 30, 2017

Related U.S. Application Data

(63) Continuation of application No. PCT/JP2016/050951, filed on Jan. 14, 2016.

(30) Foreign Application Priority Data

Mar. 9, 2015 (JP) ................................ 2015-046080

(51) Int. Cl.

*G01R 31/02* (2006.01)
*H02S 50/00* (2014.01)
*G01R 31/12* (2006.01)
*G01R 31/40* (2014.01)

(52) U.S. Cl.

CPC ......... *G01R 31/02* (2013.01); *G01R 31/1272* (2013.01); *H02S 50/00* (2013.01); *G01R 31/40* (2013.01)

(58) Field of Classification Search

None

See application file for complete search history.

(56) References Cited

U.S. PATENT DOCUMENTS

| | | | | |
|---|---|---|---|---|
| 5,214,595 A | 5/1993 | Ozawa et al. | | |
| 5,828,227 A | 10/1998 | Shiota et al. | | |
| 6,362,629 B1 * | 3/2002 | Parker ................. | G01R 31/086 | 324/521 |

(Continued)

FOREIGN PATENT DOCUMENTS

| | | |
|---|---|---|
| DE | 10318951 A1 | 11/2004 |
| JP | H7-49362 A | 2/1995 |

(Continued)

OTHER PUBLICATIONS

Extended European search report dated Feb. 23, 2018 in a counterpart European patent application.

(Continued)

*Primary Examiner* — Clayton E. LaBalle
*Assistant Examiner* — Jas A Sanghera
(74) *Attorney, Agent, or Firm* — Metrolex IP Law Group, PLLC

(57) ABSTRACT

An electric arc detection apparatus includes: a current sensor; a first filter; a second filter; an FFT processing portion that generates a high-frequency power spectrum and a low-frequency power spectrum; an electric arc detection portion that detects an electric arc by using the high-frequency power spectrum; a pseudo electric arc mask portion that determines a pseudo electric arc by using the low-frequency power spectrum; and an electric arc presence/absence determining portion.

9 Claims, 8 Drawing Sheets

(56) References Cited

U.S. PATENT DOCUMENTS

| | | | |
|---|---|---|---|
| 2008/0204950 | A1 | 8/2008 | Zhou et al. |
| 2012/0316804 | A1 | 12/2012 | Oberhauser |

FOREIGN PATENT DOCUMENTS

| | | | |
|---|---|---|---|
| JP | H7-234257 | A | 9/1995 |
| JP | 2014-134445 | A | 7/2014 |
| KR | 101376725 | B1 | 3/2014 |

OTHER PUBLICATIONS

International Search Report of PCT/JP2016/050951 dated Apr. 19, 2016.

English translation of Written Opinion of PCT/JP2016/050951 dated Apr. 19, 2016.

* cited by examiner

ELECTRIC ARC DETECTION APPARATUS AND ELECTRIC ARC DETECTION METHOD

CROSS REFERENCE TO RELATED APPLICATIONS

This application is a continuation application of International Application No. PCT/JP2016/050951, filed on Jan. 14, 2016, which claims priority based on the Article 8 of Patent Cooperation Treaty from prior Japanese Patent Application No. 2015-046080, filed on Mar. 9, 2015, the entire contents of which are incorporated herein by reference.

TECHNICAL FIELD

The disclosure relates to an electric arc detection apparatus that is included in, for example, a solar power generation system, and an electric arc detection method.

RELATED ART

In recent years, many solar power generation systems are constructed as systems for effective utilization of renewable energy. Along with this trend, the number of reports on fire accidents caused by electric arc fault in solar power generation systems is also increasing.

In a solar power generation system, in order to prevent a fire caused by an electric arc, it is necessary to rapidly shut down circuitry at the occurrence of the electric arc. For this reason, a solar power generation system includes an electric arc detection apparatus that detects an electric arc generated in the system.

In a solar power generation system that includes a solar cell string and is connected to a power conditioner, when an electric arc such as a series electric arc or a parallel electric arc is generated, noise is generated due to the electric arc. In this case, in an output line of the solar cell string (direct current power supply), a signal in which the noise generated due to the electric arc is superimposed on switching noise of the power conditioner is generated. Accordingly, the electric arc detection apparatus is configured to acquire the signal of the output line so as to acquire an electric arc signal from the acquired signal and detect the generated electric arc.

For this type of electric arc detection apparatus, configurations disclosed in Patent Documents 1 and 2 are known. Patent Document 1 discloses a solar power generation system that is connected to a power conditioner and configured to detect an electric arc through the following processing. First, an electric current flowing through the solar power generation system is detected so as to obtain a power spectrum of the detected electric current, and the obtained power spectrum is divided into a plurality of bands. Next, one or more interfering signals (noise) caused by the power conditioner are filtered from the power spectrum within a band obtained as a result of dividing the power spectrum, and an electric arc in the high voltage system is detected by using the remaining signals that are not interfering signals within the band. Also, when filtering the interfering signals, in one or more frequency bands, one or more peak values are identified, and in the one or more frequency bands, the magnitude of the power spectrum is at least partially subtracted. That is, with the configuration disclosed in Patent Document 1, an electric arc is detected, without using a pre-set frequency band (hereinafter referred to as "specified frequency band") of the interfering signals caused by the power conditioner, based on a state in which the magnitude of the power spectrum in the specified frequency band is subtracted.

On the other hand, with the configuration disclosed in Patent Document 2, an electric arc is detected by using, instead of the power spectrum of the electric current flowing through the output line of the solar cell string, a voltage power spectrum based on the fact that the noise corresponding to the magnitude of the generated electric arc is superimposed on the switching noise of the power conditioner. To be specific, a voltage is detected from the output line of the solar cell string by using a voltage sensor, a voltage power spectrum is obtained from the detected voltage, and an electric arc is detected based on the obtained power spectrum. In this case, the frequency band of the switching noise of the power conditioner is assumed to be a fixed frequency band, and the power spectrum in that frequency band is set to be out of the range of electric arc detection, and an electric arc is detected based on the power spectrum in the remaining frequency band.

RELATED ART DOCUMENTS

Patent Documents

Patent Document 1: US 2012/0316804A1 (published on Dec. 13, 2012)

Patent Document 2: JP2014-134445 (published on Jul. 24, 2014)

SUMMARY OF THE INVENTION

Problem to be Solved by the Invention

For example, as shown in FIG. 4 of Patent Document 1, a series electric arc is white noise, and its power spectrum has an upwardly protruding shape. In general, the output current from a solar cell to the power conditioner has a waveform in which an alternating current having substantially a single frequency is superimposed on a direct current. The reason that the alternating current is superimposed despite the fact that the solar cell itself serves as a direct current power supply is due to the influence of switching of a direct current/direct current converter included in the power conditioner. However, the output current from the solar cell to the power conditioner when there is a change in the operational state of the power conditioner such as at the time of starting up an independent operation of the power conditioner is a low current. As a result, the output current varies as shown in FIG. 10 without forming a waveform in which the alternating current component having substantially a single frequency is superimposed on the direct current. In this case, as indicated by a portion E shown in FIG. 10, due to a cliff-like shape of the current waveform that is on the left side, an electric arc-like noise (hereinafter referred to as "pseudo electric arc") is generated that is the noise of a frequency component similar to an electric arc (an upwardly protruding shape described above). Accordingly, the pseudo electric arc may be erroneously detected as an electric arc.

Patent Documents 1 and 2 disclose techniques for avoiding erroneous detection of an electric arc caused by the switching noise of the power conditioner, but no consideration is given to the measures against pseudo electric arc that is generated when the current is low.

Accordingly, one or more embodiments may provide an electric arc detection apparatus and an electric arc detection method with which it is possible to reduce an erroneous detection caused by a pseudo electric arc (electric arc-like noise) that is generated when the current is low.

Means for Solving the Problems

In order to solve the problem described above, an electric arc detection apparatus according to one or more embodiments includes: a current sensor that detects an electric current flowing through a power line that connects a direct current power supply and a power conversion circuit; a power spectrum conversion portion that generates a power spectrum from an output signal of the current sensor; an electric arc detection portion that detects a suspected electric arc based on a high-frequency component of the power spectrum; a pseudo electric arc determining portion that determines whether a pseudo electric arc has been generated based on a low-frequency component of the power spectrum; and an electric arc presence/absence determining portion that determines that there is an electric arc if the electric arc detection portion detects a suspected electric arc and the pseudo electric arc determining portion determines that a pseudo electric arc has not been generated, and determines that there is no electric arc if the electric arc detection portion detects a suspected electric arc and the pseudo electric arc determining portion determines that a pseudo electric arc has been generated.

Effects of the Invention

With the configuration of one or more embodiments, it is possible to produce advantageous effects such as suppressing the influence of noise generated in the power conversion circuit that is connected to the direct current power supply and enabling the occurrence of an electric arc in the power line connecting the direct current power supply and the power conversion circuit to be detected with ease and high accuracy.

EMBODIMENTS OF THE INVENTION (Overview of Solar Power Generation System)

Figure 1:
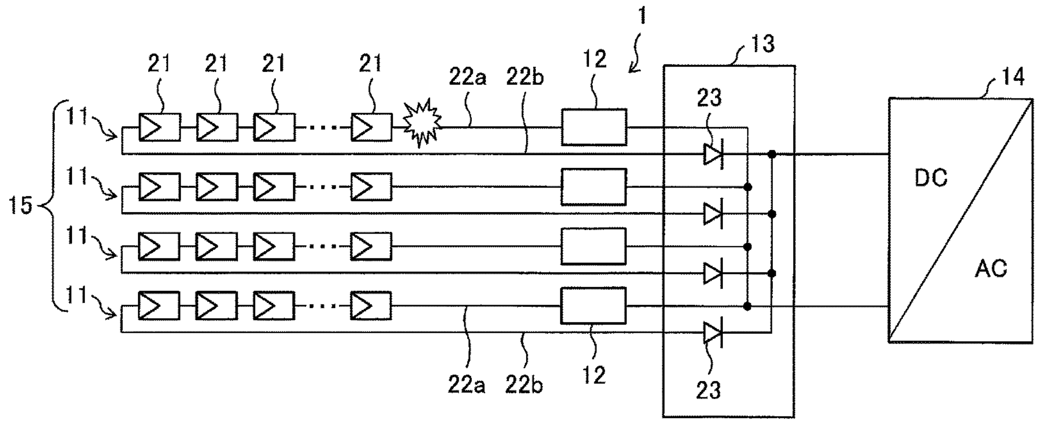
FIG. 1 is a schematic circuit diagram illustrating a configuration of a solar power generation system including an electric arc detection apparatus according to one or more embodiments.

Embodiments will be described below with reference to the drawings. FIG. 1 is a schematic circuit diagram showing a configuration of a solar power generation system including an electric arc detection apparatus according to one or more embodiment.

As shown in FIG. 1, a solar power generation system 1 includes a plurality of solar cell strings (direct current power supply) 11, a plurality of electric arc detection apparatuses 12, a junction box 13, and a power conditioning system (hereinafter referred to as "PCS") 14.

Each solar cell string 11 is composed of a plurality of solar cell modules 21 that are connected in series. The solar cell modules 21 are formed as a panel, each solar cell module including a plurality of solar cells (not shown) that are connected in series. The plurality of solar cell strings 11 constitute a solar cell array 15. Each solar cell string 11 is connected to the PCS (power conversion circuit) 14 via the junction box 13.

The PCS 14 converts direct current power input from each solar cell string 11 to alternating current power and outputs the alternating current power.

The junction box 13 connects the solar cell strings 11 in parallel. To be specific, the junction box 13 connects output lines (power lines) **22*a* that are connected to one of the terminals of each solar cell string 11, and connects output lines (power lines) 22*b* that are connected to the other terminal of each solar cell string 11. The output lines 22*b* are each provided with an anti-backflow diode 23**.

In one or more embodiments, the electric arc detection apparatuses 12 are provided, in one-to-one correspondence, on the output lines **22*a* of the solar cell strings 11**.

(Arc Detection Apparatus 12)

Figure 2:
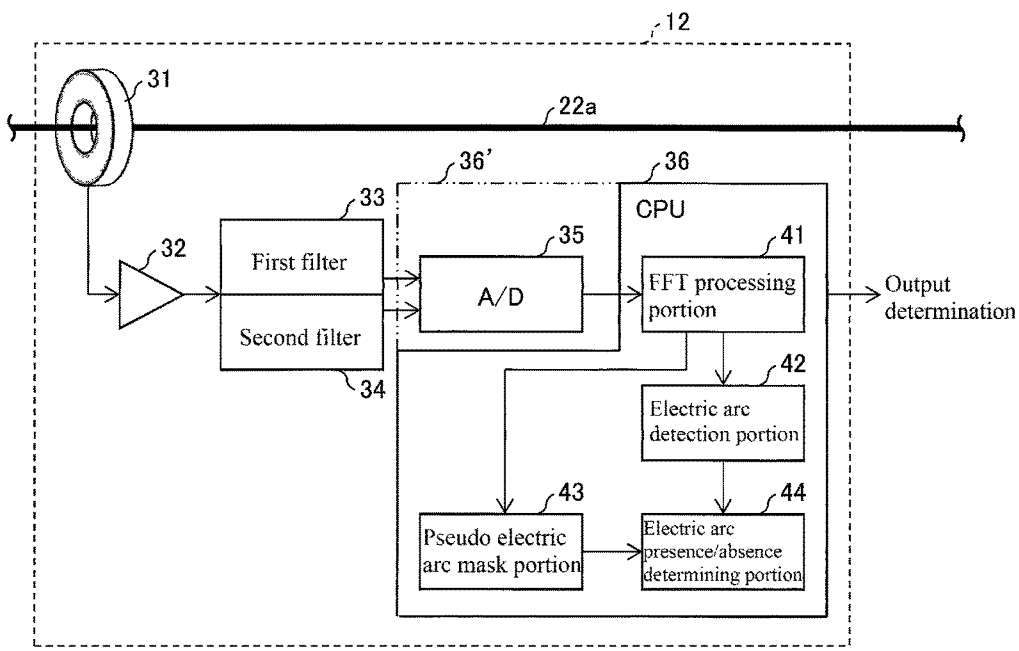
FIG. 2 is a block diagram illustrating a configuration of an electric arc detection apparatus, such as in FIG. 1.

FIG. 2 is a block diagram showing a configuration of an electric arc detection apparatus 12. As shown in FIG. 2, the electric arc detection apparatus 12 includes a current sensor 31, an amplifier 32, a first filter (high-frequency acquiring portion) 33, a second filter (low-frequency acquiring portion) 34, an A/D conversion portion 35, and a CPU (central processing unit) 36.

The current sensor 31 detects an electric current flowing through the output line **22*a*. The amplifier 32 amplifies the electric current detected by the current sensor 31**.

The first filter 33 is a band pass filter (BPF), and allows only a high-frequency current in a predetermined frequency range among the electric current output from the amplifier 32 to pass therethrough. In one or more embodiments, the electric current allowed to pass through the first filter 33 is in a frequency range of 25 kHz to 125 kHz. By setting the frequency range of the electric current allowed to pass through the first filter 33 to the above-described range, the first filter 33 excludes a signal in a frequency band in which a large amount of noise of the PCS 14 is generated.

It is also possible to use a configuration in which the output of the first filter 33 and the output of the second filter 34 are combined so as to be input into a high performance A/D converter having a wide dynamic range.

The second filter 34 is a band pass filter (BPF), and allows only a low-frequency current in a predetermined frequency range among the electric current output from the amplifier 32 to pass therethrough. In one or more embodiments, the electric current allowed to pass through the second filter 34 is in a frequency range of 25 Hz to 500 Hz. By setting the frequency range of the electric current allowed to pass through the second filter 34 to the above-described range, the second filter 34 acquires a low-frequency signal that is used to determine whether the electric arc detected by an electric arc detection portion 42 is a pseudo electric arc (electric arc-like noise) that is not the true electric arc.

If the upper limit of the frequency range of the electric current allowed to pass through the second filter 34 is set to 500 Hz, the sampling rate is as low as 1 msec, and thus the load on the CPU can be reduced. That is, the CPU that receives a signal that has passed through the second filter 34, in addition to a signal that has passed through the first filter 33, is not required to perform high-speed operations, and thus an inexpensive CPU can be used.

The A/D conversion portion 35 inputs the analog current signals that have passed through the first and second filters 33 and 34 into dedicated A/D conversion ports so as to convert the signals to digital signals. The signals obtained as a result of conversion are output to the CPU 36. As indicated by CPU 36' in FIG. 2, the CPU 36 may incorporate the A/D conversion portion 35.

The CPU 36 includes an FFT processing portion (power spectrum conversion portion) 41, an electric arc detection portion 42, a pseudo electric arc mask portion (pseudo electric arc determining portion) 43, and an electric arc presence/absence determining portion 44.

The FFT processing portion 41 performs FFT (fast fourier transform) on the high-frequency current digital signal that has passed through the first filter 33 and is input from the A/D conversion portion 35 and the low-frequency current digital signal that has passed through the second filter 34 and is input from the A/D conversion portion 35 so as to generate a power spectrum for each signal. Hereinafter, the power spectrum of the high-frequency current signal and the power spectrum of the low-frequency current signal will be referred to simply as "high-frequency power spectrum" and "low-frequency power spectrum", respectively.

The electric arc detection portion 42 detects electric arc noise, or in other words, an electric arc included in the high-frequency power spectrum input from the FFT processing portion 41. Note that the electric arcs detected by the electric arc detection portion 42 may include a pseudo electric arc as described above that is not the true electric arc. Accordingly, to put it accurately, an electric arc detected by the electric arc detection portion 42 is a suspected electric arc that is suspected to be an electric arc.

As the electric arc detection method performed by the electric arc detection portion 42, any conventionally known method can be used including the methods disclosed in Patent Documents 1 and 2. Alternatively, as an example, the following method can be used.

Figure 3:
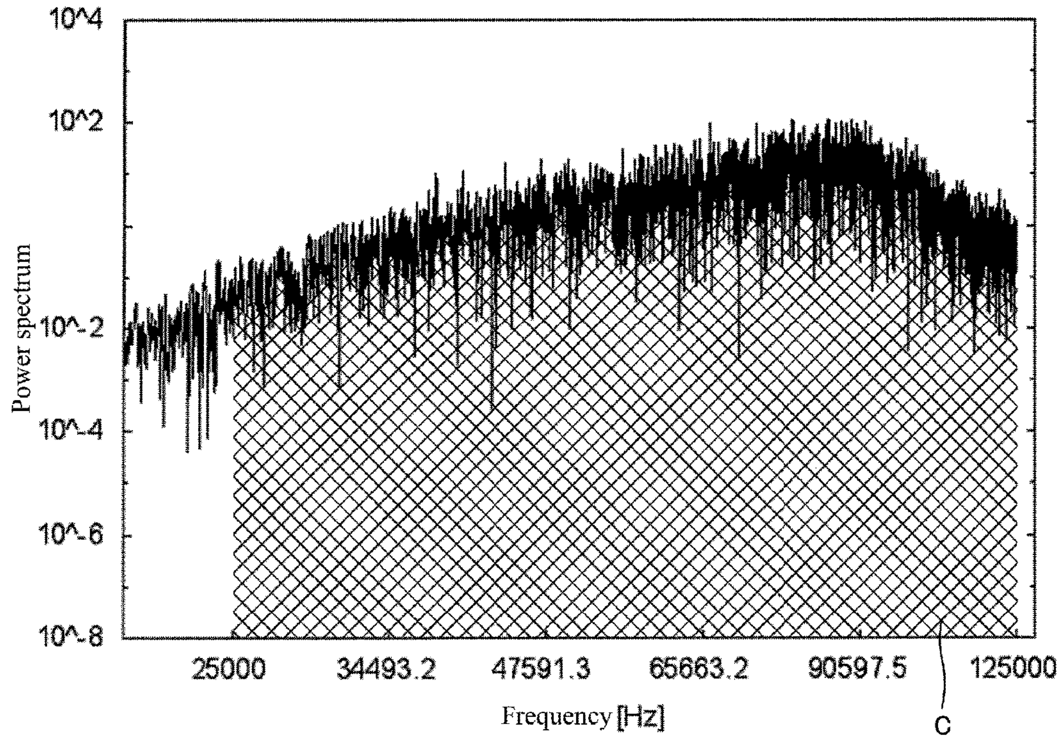
FIG. 3 is a graph illustrating a high-frequency current power spectrum (FFT waveform) in which an electric arc is generated.

FIG. 3 is a graph showing a high-frequency power spectrum (FFT waveform) in which an electric arc is generated. FIG. 3 is a log-log graph, and when an electric arc is generated, the power spectrum forms a bulge (curves upward). Accordingly, the area of a lower region (meshed region in FIG. 3) in the power spectrum can be used as a feature amount (feature amount C) for detecting an electric arc. That is, the electric arc detection portion 42 can detect an electric arc by comparing the feature amount C (the area of the meshed region) obtained from the high-frequency power spectrum with a threshold value K when detecting an electric arc.

The threshold value K can be determined from the area of the meshed region when an electric arc is not generated and the area of the meshed region when an electric arc is generated.

Furthermore, the electric arc detection portion 42 repeatedly performs the above-described operation, for example, every predetermined time interval. During the repeated operation, if an electric arc is detected continuously a predetermined number of times (for example, ten times) or more, the electric arc detection portion 42 outputs a detection result indicating that an electric arc has been detected.

The pseudo electric arc mask portion 43 determines, based on the low-frequency power spectrum input from the FFT processing portion 41, whether or not a pseudo electric arc has been generated, and activates a pseudo electric arc mask if it is determined that a pseudo electric arc has been generated. As used herein, the expression "to activate a pseudo electric arc mask" means to invalidate the detection result of the electric arc detection portion 42 indicating that an electric arc has been generated.

Figure 10:
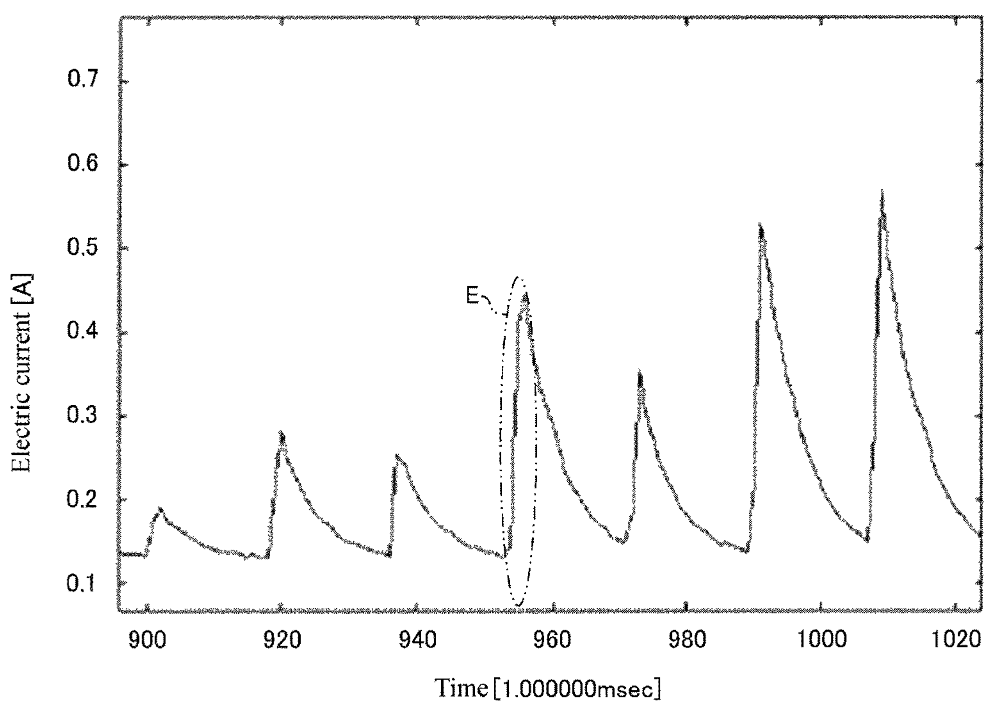
FIG. 10 is a waveform graph illustrating a change in consumed current when there is a change in the operational state of a power conditioner.

As used herein, the term "pseudo electric arc" refers to a phenomenon in which, for example, a low-frequency signal generated by switching noise of the PCS (power conditioning system) 14 forms an asymmetric current waveform as shown in FIG. 10, and even though the low frequency signal is intermittent, an abrupt current change appears as a frequency component in a high-frequency domain, which is detected as an electric arc. As a result of in-depth studies, the present inventors found that a pseudo electric arc is generated in the manner as described above.

Figure 4:
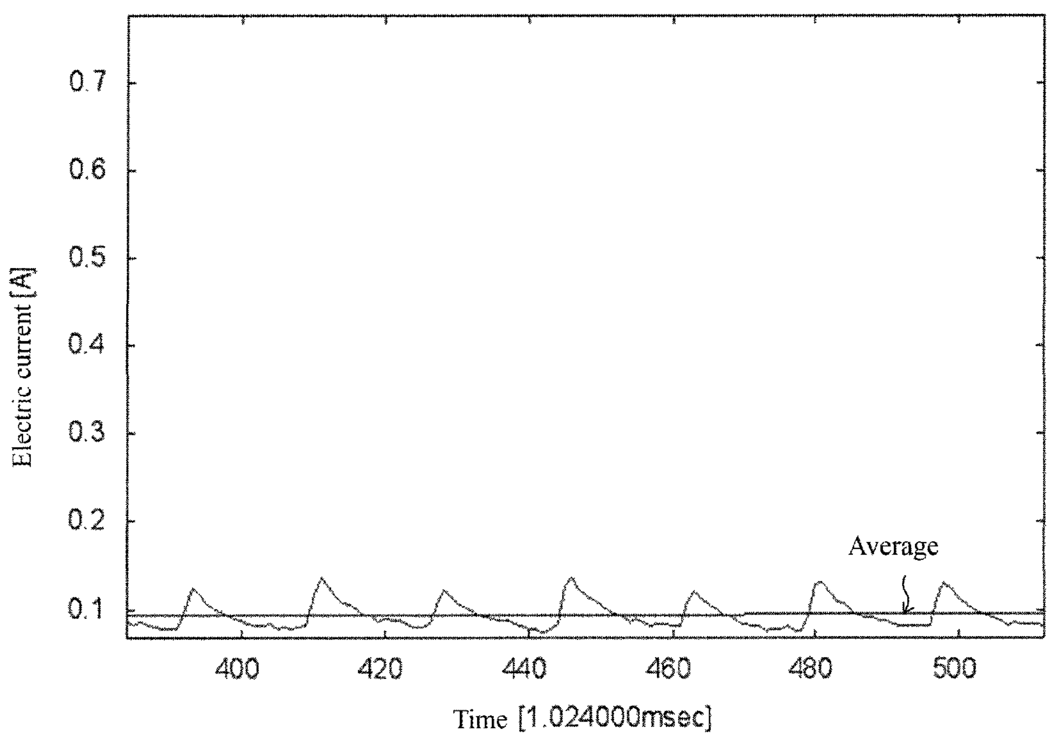
FIG. 4 is a time-domain waveform graph at a low frequency of an electric current flowing through an output line, such as in FIG. 2.

FIG. 4 is a time-domain waveform graph at a low frequency of an electric current flowing through the output line **22*a* when a pseudo electric arc phenomenon has occurred. As shown in FIG. 4**, in the data of pseudo electric arc, as a common feature, a sawtooth-shaped periodic component is observed in the time-domain current waveform.

Figure 5:
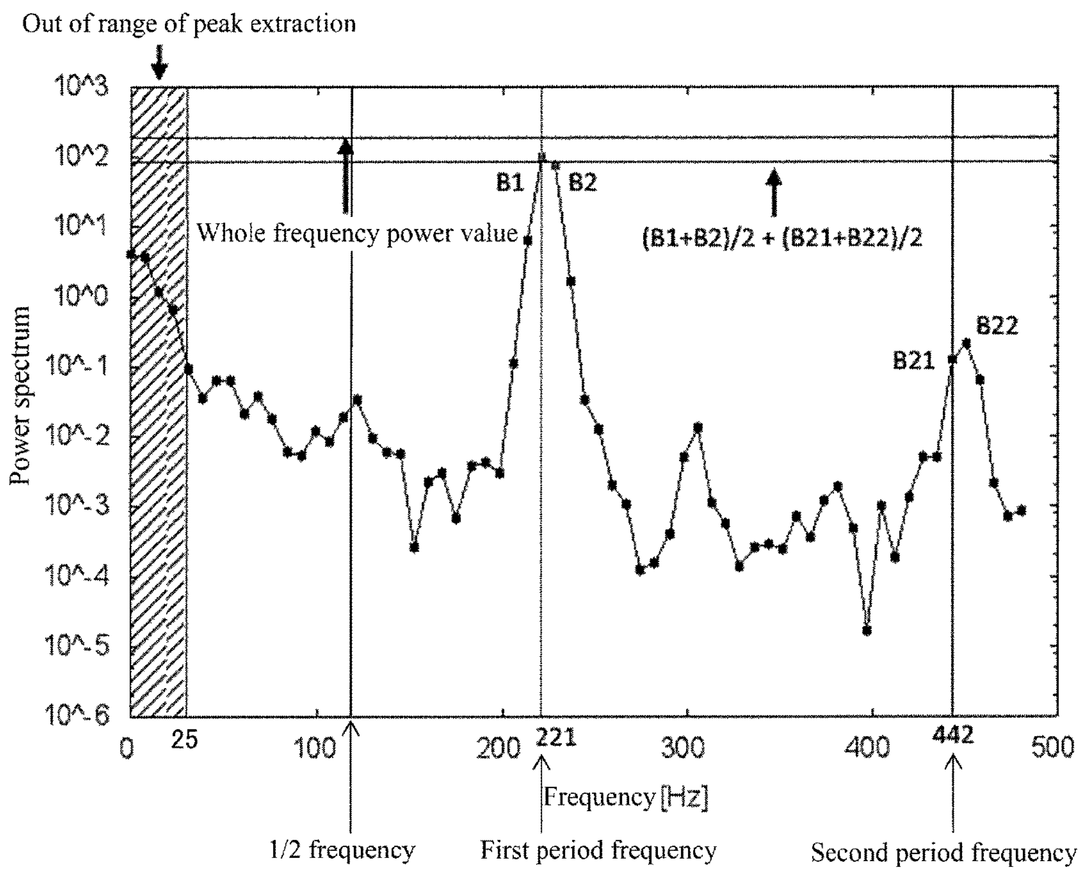
FIG. 5 is a graph illustrating a low-frequency power spectrum (FFT waveform) of an electric current flowing through an output line, such as in FIG. 2.

FIG. 5 is a graph showing a low-frequency power spectrum (FFT waveform) of the electric current flowing through the output line **22*a* when a pseudo electric arc phenomenon has occurred. As a result of fourier transform of the sawtooth-shaped waveform shown in FIG. 4, as shown in FIG. 5, the power spectrum increases at a first period (basic period) frequency (for example, 221 Hz), a second period frequency (a harmonic that is twice the basic period frequency), and a ½ frequency (a fractional frequency that is half the basic period frequency). As described above, in the low-frequency domain, the power increases at the first period (basic period) frequency as well as its fractional frequency and harmonic, from which it can be seen that a pseudo electric arc has been generated, and thus it is possible to invalidate the detection result of the electric arc detection portion 42** indicating that an electric arc has been generated.

The frequency of 221 Hz mentioned above is a frequency at which a pseudo electric arc was generated in the actual measurement, and in order to include a second harmonic and a ½ fractional frequency of 221 Hz as a detection range, in the second filter 34, the passing frequency range is set to 25 Hz to 500 Hz.

The electric arc presence/absence determining portion 44 performs the final determination as to whether or not an electric arc has been generated in the solar power generation system 1, based on the result of electric arc detection performed by the electric arc detection portion 42 and the result of determination as to whether the electric arc detected by the electric arc detection portion 42 is a pseudo electric arc performed by the pseudo electric arc mask portion 43.

(Operations of Electric Arc Detection Apparatus 12)

In the configuration described above, operations performed by the electric arc detection apparatus 12 will be described below.

The first filter 33 allows a signal within a frequency range of 20 kHz to 125 kHz (high-frequency signal) among the electric current that has been detected from the output line 22*a* by the current sensor 31 and amplified by the amplifier 32 to pass therethrough. The second filter 34 allows a signal within a frequency range of 25 Hz to 500 Hz (low-frequency signal) among the electric current that has been detected from the output line 22*a* by the current sensor 31 and amplified by the amplifier 32 to pass therethrough. These signals are converted to digital signals by the A/D conversion portion 35 and then input into the CPU 36.

The FFT processing portion 41 performs FFT processing on the digital signal of the high-frequency current input from the A/D conversion portion 35 and the digital signal of the low-frequency current input from the A/D conversion portion 35, and generates a power spectrum for each signal. The electric arc detection portion 42 detects electric arc noise, or in other words, an electric arc included in the power spectrum of the high-frequency current input from the FFT processing portion 41.

Figure 6:
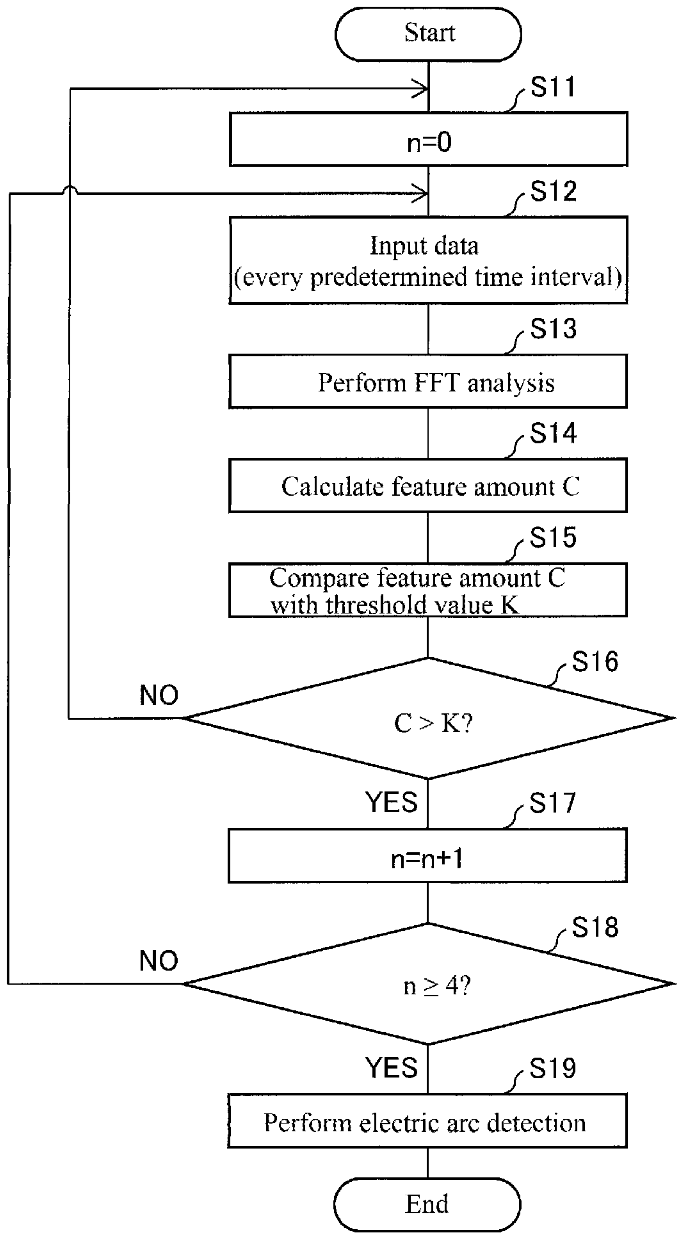
FIG. 6 is a flowchart illustrating operations performed by an electric arc detection portion, such as in FIG. 2.

FIG. 6 is a flowchart illustrating operations performed by the electric arc detection portion 42. As shown in FIG. 6, the electric arc detection portion 42 first resets a counter n (S11). The FFT processing portion 41 receives an input of the high-frequency current signal output from the A/D conversion portion 35 every predetermined time interval (S12), performs FFT processing (FFT analysis), and generates a high-frequency power spectrum as shown in FIG. 3 (S13).

Next, the electric arc detection portion 42 calculates a feature amount C (the area of the meshed region shown in FIG. 3) in the generated power spectrum (S14), and compares the calculated feature amount C with a threshold value K (515). As a result, if the feature amount C is less than or equal to the threshold value K (S16), the processing returns to S11.

If, on the other hand, the feature amount C is greater than the threshold value K (S16), the electric arc detection portion 42 increments the counter n by one (S17), and determines whether the value of the counter n is greater than or equal to 4 (S18). As a result of the determination, if n is less than 4, the processing returns to S12. If, on the other hand, n is greater than or equal to 4, the electric arc detection portion 42 outputs a detection result indicating that an electric arc has been detected (S19), and the processing ends.

Figure 7:
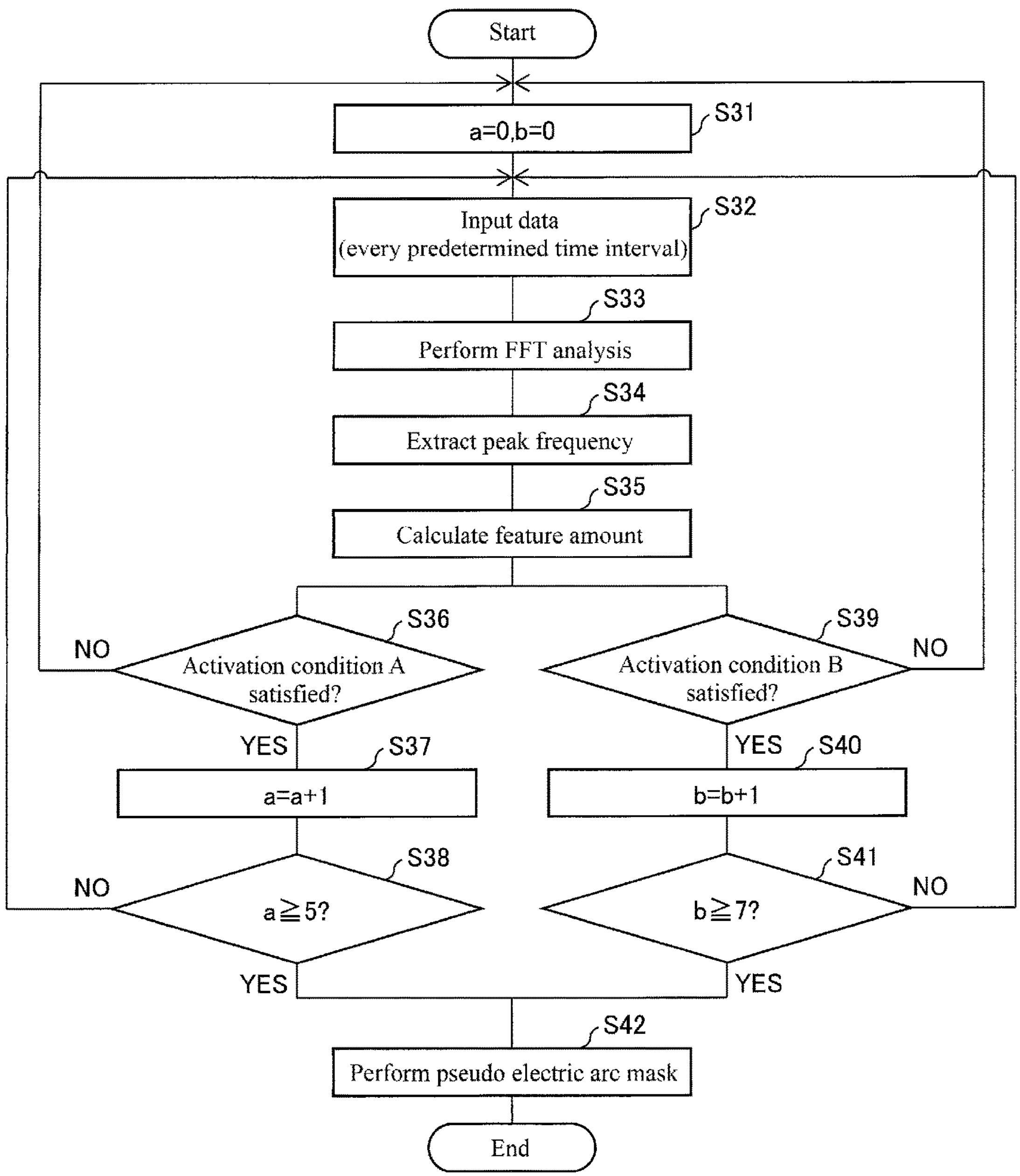
FIG. 7 is a flowchart illustrating operations performed by a pseudo electric arc mask portion, such as in FIG. 2.

Next, operations performed by the pseudo electric arc mask portion 43 will be described. FIG. 7 is a flowchart illustrating operations performed by the pseudo electric arc mask portion 43.

As shown in FIG. 7, the pseudo electric arc mask portion 43 first resets counters a and b (S31). The FFT processing portion 41 receives an input of the low-frequency current signal output from the A/D conversion portion 35 every predetermined time interval (S32), performs FFT processing (FFT analysis), and generates a low-frequency power spectrum as shown in FIG. 5 (S33).

Next, the pseudo electric arc mask portion 43 extracts a frequency at a peak of a mountain-like shape in the generated power spectrum (S34), and calculates a feature amount. After that, the pseudo electric arc mask portion 43 performs the operations of S36 to S38 and S42, and the operations of S39 to S42.

In S34, the frequency at which the low-frequency power spectrum has a (maximum) peak is, in the example shown in FIG. 5, the first period frequency (basic period frequency, 221 Hz), and the order of the magnitude of power is as follows: the first period frequency; the second period frequency (a harmonic that is twice the basic period frequency, 442 Hz); and the ½ frequency (a fractional frequency that is half the basic period frequency (110.5 Hz)). Also, in S35, the feature amount includes the power value of the peak (first period) in the low-frequency power spectrum, and the whole frequency power value in the low-frequency power spectrum (the total value of power in the whole frequency (25 Hz to 500 Hz)).

An activation condition A (first activation condition) shown in S36 includes the following conditions (1) and (2):

$$(\text{power value of peak/whole frequency power value})>0.5;\ \text{and} \tag{1}$$

$$(\text{power value of double frequency/whole frequency power value})>0.01. \tag{2}$$

With respect to the condition (1), 0.5 (or 0.5×(whole frequency power value)) can be regarded as a first threshold. With respect to the condition (2), 0.01 (or 0.01×(whole frequency power value)) can be regarded as a second threshold.

A discrete value shown here such as 0.5 is applied when the increment of the low-frequency spectrum is about 8 Hz. The value may be changed if the increment of the frequency is changed.

The activation condition A is set with the intention of the following points. To be specific, if the sawtooth-shaped waveform appearing at a low frequency of the current signal is fourier transformed by the FFT processing portion 41, not only the power spectrum of the first period, but also the power spectrum of the second period (or ½ period) appears remarkably. Accordingly, with the condition (1), the periodicity of the sawtooth-shaped waveform in the power spectrum is detected, and with the condition (2), the power spectrum of the second period (or ½ period) is made prominent and detected. With this configuration, a feature of the sawtooth-shaped waveform appearing at the low frequency of the current signal is captured, and a feature common to the data of pseudo electric arc is detected. Instead of the second period frequency, it is also possible to use the ½ frequency (a fractional frequency that is half the basic period frequency (110.5 Hz)).

Likewise, an activation condition B (second activation condition) shown in S39 includes the following condition (3):

$$(\text{power value of double frequency/whole frequency power value})>0.03. \tag{3}$$

With respect to the condition (3), 0.03 (or 0.03×(whole frequency power value)) can be regarded as a third threshold.

The activation condition B is set with the intention of the following points. To be specific, with the use of the activation condition A alone, if the amplitude of the sawtooth-shaped waveform changes (increases or decreases) with time while the sawtooth-shaped waveform is maintained, the condition (1) may not be satisfied. Accordingly, the activation condition B is added as an OR condition such that in the case where the feature of the sawtooth-shaped waveform is particularly remarkable, the pseudo electric arc mask is activated only with the condition (3).

In S36, a determination is made as to whether the activation condition A is satisfied. If the activation condition A is not satisfied, the processing returns to S31. If, on the other hand, the activation condition A is satisfied, in S37, the value of the counter a is incremented by one. Then, in S38, a determination is made as to whether the value of the counter a is greater than or equal to 5. As a result of the determination, if the value of the counter a is less than 5, the processing returns to S32. If, on the other hand, the value of the counter a is greater than or equal to 5, in S42, a pseudo electric arc mask is activated. In this way, in the operations based on the activation condition A, if the activation condition A (including the conditions (1) and (2) given above) is continuously satisfied five times or more, the pseudo electric arc mask is activated. Here, as used herein, the term "pseudo electric arc mask" refers to processing for determining the electric arc (suspected electric arc) detected by the electric arc detection portion 42 as a pseudo electric arc, or in other words, processing for invalidating the detection of the electric arc by the electric arc detection portion 42.

Likewise, in S39, a determination is made as to whether the activation condition B is satisfied. If the activation condition B is not satisfied, the processing returns to S31. If, on the other hand, the activation condition B is satisfied, in S40, the value of counter b is incremented by one. Then, in S41, a determination is made as to whether the value of counter b is greater than or equal to 7. As a result of the determination, if the value of counter b is less than 7, the processing returns to S32. If, on the other hand, the value of counter b is greater than or equal to 7, in S42, a pseudo electric arc mask is activated. In this way, in the operations based on the activation condition B, if the activation condition B (the condition (3) given above) is continuously satisfied seven times or more, the pseudo electric arc mask is activated.

Figure 8:
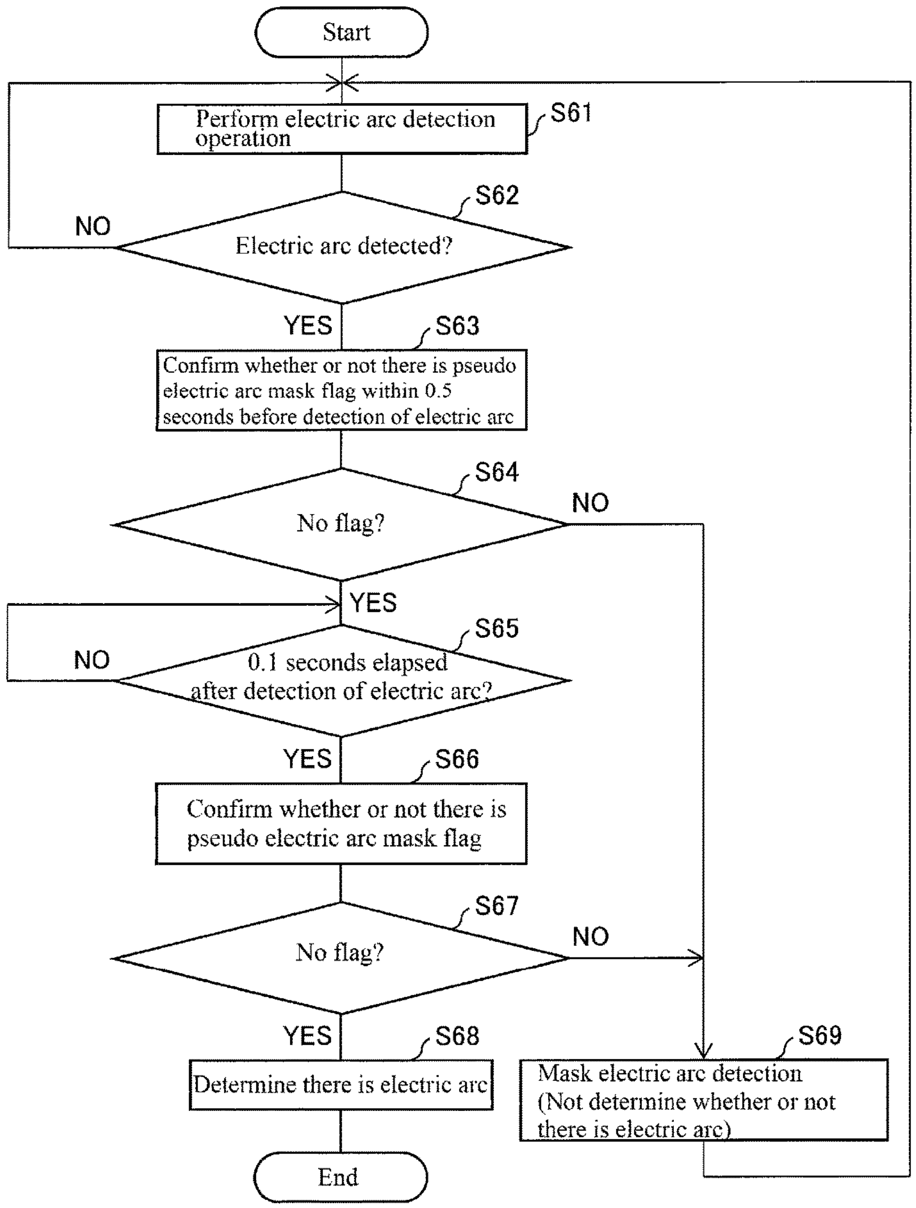
FIG. 8 is a flowchart illustrating operations performed by an electric arc presence/absence determining portion, such as in FIG. 2.

Next, operations performed by the electric arc presence/absence determining portion 44 will be described. FIG. 8 is a flowchart illustrating operations performed by the electric arc presence/absence determining portion 44.

As shown in FIG. 8, when the electric arc detection portion 42 performs an electric arc detection operation (S61), and if the electric arc detection portion 42 detects an electric arc (suspected electric arc) (S62), the pseudo electric arc mask portion 43 confirms whether or not there is a pseudo electric arc mask flag within 0.5 seconds before the detection of the electric arc by the electric arc detection portion 42 (S63).

The pseudo electric arc mask flag is a flag indicating that the pseudo electric arc mask is in operation. Accordingly, if there is a pseudo electric arc mask flag, it means that the pseudo electric arc mask is performed by the pseudo electric arc mask portion 43 (see S42 in FIG. 7). The reason that a confirmation is made as to whether or not there is a pseudo electric arc mask flag within 0.5 seconds before the detection of the electric arc is to prevent an erroneous determination that may be made if a determination is made as to whether or not there is an electric arc only by determining whether or not there is a pseudo electric arc mask flag at the time of the detection of the electric arc (0 seconds). That is, the operations performed by the electric arc detection portion 42, the pseudo electric arc mask portion 43, and the electric arc presence/absence determining portion 44 are processing for the low-frequency power spectrum, and the response is delayed. Accordingly, a leeway for the delay is taken into account. Also, the time period of within 0.5 seconds is merely an example, and is a preferred time period obtained as a result of experiment.

As a result of the confirmation in S63, it there is no pseudo electric arc mask flag (S64), the electric arc presence/absence determining portion 44 further waits for 0.1 seconds to elapse after the detection of the electric arc (suspected electric arc). After the elapse of 0.1 seconds after the detection of the electric arc, the electric arc presence/absence determining portion 44 confirms whether or not there is a pseudo electric arc mask flag within 0.1 seconds after the detection of the electric arc by the electric arc detection portion 42 (S66).

The reason that a confirmation is made as to whether or not there is a pseudo electric arc mask flag within 0.1 seconds after the detection of the electric arc is the same as the reason that a confirmation is made in S63 as to whether or not there is a pseudo electric arc mask flag within 0.5 seconds before the detection of the electric arc. Also, the time period of within 0.1 seconds is merely an example, and is a preferred time period obtained as a result of experiment by taking into consideration a time delay in determination of the result of processing of the low-frequency signal that has a limitation in time response.

As a result of the confirmation in S66, if there is no pseudo electric arc mask flag (S67), a determination result indicating that there is an electric arc is output (S68). This determination result is output as a detection result of the electric arc detection apparatus 12 indicating that there is an electric arc.

If, on the other hand, there is a pseudo electric arc mask flag in S64 or S67, the electric arc presence/absence determining portion 44 masks the detection result indicating that an electric arc has been detected by the electric arc detection portion 42, and the processing returns to S61 (S69). That is, in S69, the detection of the electric arc by the electric arc detection portion 42 is invalidated, and it is determined that there is no electric arc.

(Advantage of Electric Arc Detection Apparatus 12)

As described above, in the electric arc detection apparatus 12, the electric arc presence/absence determining portion 44 determines that there is an electric arc only if the electric arc detection portion 42 detects an electric arc (suspected electric arc) based on the high-frequency power spectrum (the power spectrum in a high-frequency domain of the electric current flowing through the output line 22*a*), and the pseudo electric arc mask portion 43 determines that the electric arc (suspected electric arc) is not a pseudo electric arc based on the low-frequency power spectrum (the power spectrum in a low-frequency domain of the electric current flowing through the output line 22*a*). That is, even if the electric arc detection portion 42 detects an electric arc, if the pseudo electric arc mask portion 43 determines that the electric arc is a pseudo electric arc, the electric arc presence/absence determining portion 44 invalidates the detection of the electric arc by the electric arc detection portion 42.

In the operations described above, the pseudo electric arc mask portion 43 makes a determination as to whether the electric arc detected by the electric arc detection portion 42 is a pseudo electric arc based on the low-frequency power spectrum, and thus even when an alternating current component that cannot be described with a single frequency is superimposed on a direct current caused by a low current, the occurrence of an erroneous detection of electric arc can be reduced.

Also, the electric arc detection apparatus 12 includes, as a band pass filter, a dual filter including a first filter 33 that processes the high-frequency domain signal of the electric current flowing through the output line 22*a* and a second filter 34 that processes the low-frequency domain signal of the electric current flowing through the output line 22*a*. Accordingly, the A/D conversion portion 35 can be configured at a low cost by using an all-purpose A/D converter originally incorporated in the CPU 36, with zero additional cost, instead of a high-speed and high-resolution A/D converter that is highly expensive.

Variation

Figure 9:
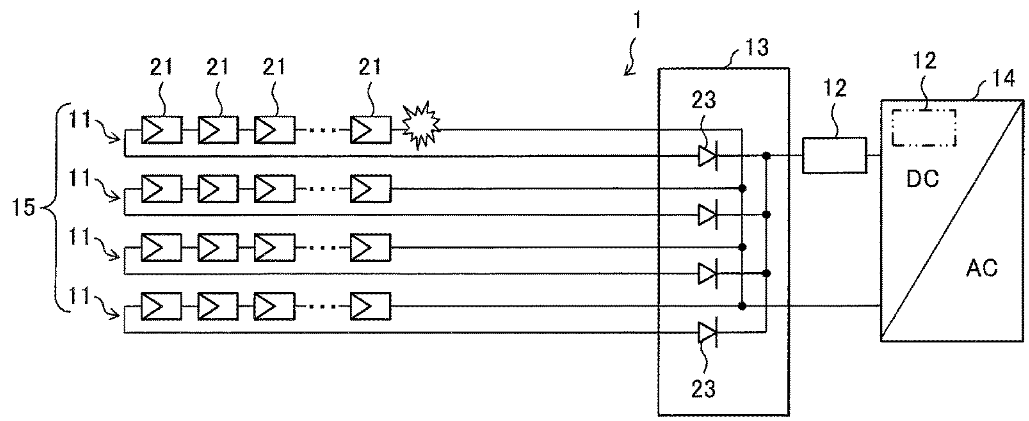
FIG. 9 is a schematic circuit diagram illustrating a variation of a solar power generation system, such as in FIG. 1.

FIG. 9 is a schematic circuit diagram showing a variation of the solar power generation system 1 shown in FIG. 1. In one or more embodiments given above, an example was described in which the electric arc detection apparatuses 12 were provided on the solar cell strings 11 in one-to-one correspondence. However, the arrangement of the electric arc detection apparatuses 12 is not limited thereto. To be specific, as shown in FIG. 9, it is possible to provide only one electric arc detection apparatus 12 in a solar power generation system 1 including a plurality of solar cell strings 11. In the example shown in FIG. 9, the electric arc detection apparatus 12 is provided downstream of the junction box 13, or in other words, between the junction box 13 and the PCS 14.

Alternatively, as shown in FIG. 9, the electric arc detection apparatus 12 may be provided inside the casing of the PCS 14 instead of between the junction box 13 and the PCS 14.

Summary

The electric arc detection apparatus according to one or more embodiments includes: a current sensor that detects an electric current flowing through a power line that connects a direct current power supply and a power conversion circuit; a power spectrum conversion portion that generates a power spectrum from an output signal of the current sensor; an electric arc detection portion that detects a suspected electric arc based on a high-frequency component of the power spectrum; a pseudo electric arc determining portion that determines whether a pseudo electric arc has been generated based on a low-frequency component of the power spectrum; and an electric arc presence/absence determining portion that determines that there is an electric arc if the electric arc detection portion detects a suspected electric arc and the pseudo electric arc determining portion determines that a pseudo electric arc has not been generated, and determines that there is no electric arc if the electric arc detection portion detects a suspected electric arc and the pseudo electric arc determining portion determines that a pseudo electric arc has been generated.

With the configuration described above, the current sensor detects an electric current flowing through the power line connecting the direct current power supply and the power conversion circuit. The power spectrum conversion portion generates a power spectrum from the output signal of the current sensor. The electric arc detection portion detects a suspected electric arc based on a high-frequency component of the power spectrum, and the pseudo electric arc determining portion determines, based on a low-frequency component of the power spectrum, whether a pseudo electric arc has been generated. The electric arc presence/absence determining portion determines that there is an electric arc if the electric arc detection portion detects a suspected electric arc and the pseudo electric arc determining portion determines that a pseudo electric arc has not been generated. If, on the other hand, the electric arc detection portion detects a suspected electric arc and the pseudo electric arc determining portion determines that a pseudo electric arc has been generated, the electric arc presence/absence determining portion determines that there is no electric arc.

Accordingly, it is unnecessary to tune, in advance, the frequency band of noise (for example, switching noise) generated by the power conversion circuit (for example, PCS). Thus, the electric arc detection apparatus can suppress an erroneous detection of electric arc and detect the occurrence of an electric arc with ease and high accuracy.

The electric arc detection apparatus described above may include: a high-frequency acquiring portion that acquires a high-frequency signal from the output signal of the current sensor; and a low-frequency acquiring portion that acquires a low-frequency signal from the output signal of the current sensor, and the power spectrum conversion portion may generate, from the high-frequency signal and the low-frequency signal, a high-frequency power spectrum as a high-frequency component of the power spectrum and a low-frequency power spectrum as a low-frequency component of the power spectrum.

With the configuration described above, in the electric arc detection apparatus, a high-frequency signal is acquired from the output signal of the current sensor by the high-frequency acquiring portion, a low-frequency signal is acquired from the output signal of the current sensor by the low-frequency acquiring portion, and a high-frequency power spectrum and a low-frequency power spectrum are generated from the high-frequency signal and the low-frequency signal by the power spectrum conversion portion. Accordingly, it is unnecessary to configure the high-frequency acquiring portion and the low-frequency acquiring portion by using high performance and highly expensive circuits (for example, high-speed and high-resolution dedicated A/D converters), and thus the high-frequency acquiring portion and the low-frequency acquiring portion can be configured at a low cost by using all-purpose A/D converters incorporated in the CPU.

In the electric arc detection apparatus described above, the pseudo electric arc determining portion may determine that the electric arc is a pseudo electric arc if a first activation condition is satisfied a predetermined number of times or more, and the first activation condition may include a condition that power of a first period having highest power in the low-frequency component of the power spectrum is greater than a first threshold and a condition that power of a harmonic or fractional frequency of the first period is greater than a second threshold.

With the configuration described above, the pseudo electric arc determining portion determines that the electric arc is a pseudo arc if a first activation condition is satisfied a predetermined number of times or more, the first activation condition including a condition that the power of a first period having the highest power in the low-frequency component of the power spectrum is greater than a first threshold (condition (1)) and a condition that the power of a harmonic or fractional frequency of the first period is greater than a second threshold (condition (2)). With this configuration, it is possible to determine, with high accuracy, whether the electric arc is a pseudo arc.

That is, at a low frequency of the current signal, a periodic sawtooth-shaped waveform appears due to the switching noise of the power conversion circuit or the like, and in a low-frequency power spectrum obtained as a result of FFT processing of the periodic sawtooth-shaped waveform, not only the power spectrum of the first period, but also the power spectrum of a harmonic or fractional frequency of the first period appears remarkably. Accordingly, with the condition (1), the periodicity of the sawtooth-shaped waveform in the power spectrum is detected, and with the condition (2), the power spectrum of the harmonic or fractional frequency of the first period is made prominent and detected. It is thereby possible to determine, with high accuracy, whether the electric arc is a pseudo arc.

In the electric arc detection apparatus described above, the pseudo electric arc determining portion may determine that the electric arc is a pseudo electric arc if a second activation condition is satisfied a predetermined number of times or more, and the second activation condition may include a condition that power of a harmonic or fractional frequency of the first period is smaller than the first threshold and is greater than a third threshold.

With the configuration described above, the pseudo electric arc determining portion determines that the electric arc is a pseudo electric arc if a second activation condition is satisfied a predetermined number of times or more, the second activation condition including a condition that the power of a harmonic or fractional frequency of the first period is smaller than the first threshold and is greater than a third threshold (condition (3)). It is thereby possible to determine, with higher accuracy, whether the electric arc is a pseudo arc.

To be specific, with the use of the first activation condition, if the amplitude of the sawtooth-shaped waveform changes (increases or decreases) with time while the sawtooth-shaped waveform is maintained, the condition (1) may not be satisfied. On the other hand, if the feature of the sawtooth-shaped waveform is particularly remarkable (condition (3)), it is possible to determine that the electric arc is a pseudo arc, and thus it is possible to determine, with high accuracy, whether the electric arc is a pseudo arc.

In the electric arc detection apparatus described above, the electric arc detection portion may define, in the high-frequency power spectrum, an area of a lower region in the high-frequency power spectrum as a feature amount, and detect an electric arc by comparing the feature amount with a predetermined threshold value.

With the configuration described above, in the high-frequency power spectrum, if an electric arc is included, the high-frequency power spectrum forms a bulge protruding upward. If, on the other hand, an electric arc is not included, the high-frequency power spectrum is substantially flat. Accordingly, the area of the lower region in the high-frequency power spectrum can be used as a feature amount, and by comparing the feature amount with a predetermined threshold value, it is possible to detect an electric arc with high accuracy.

An electric arc detection method according to one or more embodiments includes: an electric current detection step of detecting an electric current flowing through a power line that connects a direct current power supply and a power conversion circuit; a power spectrum converting step of generating a power spectrum from a signal of the electric current detected in the electric current detection step; an electric arc detection step of detecting a suspected electric arc based on a high-frequency component of the power spectrum; a pseudo electric arc determining step of determining, based on a low-frequency component of the power spectrum, whether a pseudo electric arc has been generated; and an electric arc presence/absence determining step of determining that there is an electric arc if a suspected electric arc is detected in the electric arc detection step and it is determined in the pseudo electric arc determining step that a pseudo electric arc has not been generated, and determining that there is no electric arc if a suspected electric arc is detected in the electric arc detection step and it is determined in the pseudo electric arc determining step that a pseudo electric arc has been generated.

With the configuration described above, it is possible to produce the same advantageous effects as those of the electric arc detection apparatus described above.

The present invention is not limited to the embodiments described above, and various types of modifications can be made within the scope recited in the appended claims. Embodiments obtained by combining technical means disclosed in the embodiments as appropriate also fall within the technical scope of the present invention.

INDUSTRIAL APPLICABILITY

One or more embodiments can be used as an electric arc detection apparatus for use in a solar power generation system including a solar cell string connected to a PCS that is a noise generation source.

INDEX TO THE REFERENCE NUMERALS

1 Solar Power Generation System
11 Solar Cell String (Direct Current Power Supply)
12 Electric Arc Detection Apparatus
13 Junction Box
14 Power Conditioning System (Power Conversion Circuit)
15 Solar Cell Array
21 Solar Cell Module
**22*a*** Output Line (Power Line)
**22*b*** Output Line (Power Line)
31 Current Sensor
32 Amplifier
33 First Filter (High-Frequency Acquiring Portion)
34 Second Filter (Low-Frequency Acquiring Portion)
36 CPU
41 FFT Processing Portion
42 Electric Arc Detection Portion
43 Pseudo Electric Arc Mask Portion (Pseudo Electric Arc Determining Portion)
44 Electric Arc Presence/Absence Determining Portion

The invention claimed is:

1. An electric arc detection apparatus comprising:
- a current sensor that detects an electric current flowing through a power line that connects a direct current power supply and a power conversion circuit;
- a power spectrum conversion portion that generates a power spectrum from an output signal of the current sensor;
- an electric arc detection portion that detects a suspected electric arc based on a high-frequency component of the power spectrum;
- a pseudo electric arc determining portion that determines whether a pseudo electric arc has been generated based on a low-frequency component of the power spectrum; and
- an electric arc presence/absence determining portion that determines that there is an electric arc in response to the electric arc detection portion detecting a suspected electric arc and the pseudo electric arc determining portion determining that a pseudo electric arc has not been generated, and determines that there is no electric arc in response to the electric arc detection portion detecting a suspected electric arc and the pseudo electric arc determining portion determining that a pseudo electric arc has been generated.

2. The electric arc detection apparatus according to claim 1, comprising:
- a high-frequency acquiring portion that acquires a high-frequency signal from the output signal of the current sensor; and a low-frequency acquiring portion that acquires a low-frequency signal from the output signal of the current sensor, wherein the power spectrum conversion portion generates, from the high-frequency signal and the low-frequency signal, a high-frequency power spectrum as the high-frequency component of the power spectrum and a low-frequency power spectrum as the low-frequency component of the power spectrum.

3. The electric arc detection apparatus according to claim 2, wherein the pseudo electric arc determining portion determines that the electric arc is a pseudo electric arc in response to a first activation condition being satisfied a predetermined number of times or more, and the first activation condition includes a condition that power of a first period having highest power in the low-frequency component of the power spectrum is greater than a first threshold and a condition that power of a harmonic or fractional frequency of the first period is greater than a second threshold.

4. The electric arc detection apparatus according to claim 3, wherein the pseudo electric arc determining portion determines that the electric arc is a pseudo electric arc in response to a second activation condition being satisfied a predetermined number of times or more, and the second activation condition includes a condition that power of a harmonic or fractional frequency of the first period is smaller than the first threshold and is greater than a third threshold.

5. The electric arc detection apparatus according to claim 2, wherein the electric arc detection portion defines, in the high-frequency power spectrum, an area of a lower region in the high-frequency power spectrum as a feature amount, and detects an electric arc by comparing the feature amount with a predetermined threshold value.

6. The electric arc detection apparatus according to claim 1, wherein the pseudo electric arc determining portion determines that the electric arc is a pseudo electric arc in response to a first activation condition being satisfied a predetermined number of times or more, and the first activation condition includes a condition that power of a first period having highest power in the low-frequency component of the power spectrum is greater than a first threshold and a condition that power of a harmonic or fractional frequency of the first period is greater than a second threshold.

7. The electric arc detection apparatus according to claim 6, wherein the pseudo electric arc determining portion determines that the electric arc is a pseudo electric arc in response to a second activation condition being satisfied a predetermined number of times or more, and the second activation condition includes a condition that power of a harmonic or fractional frequency of the first period is smaller than the first threshold and is greater than a third threshold.

8. The electric arc detection apparatus according to claim 1, wherein the electric arc detection portion defines, in a high-frequency power spectrum, an area of a lower region in the high-frequency power spectrum as a feature amount, and detects an electric arc by comparing the feature amount with a predetermined threshold value.

9. An electric arc detection method comprising:

detecting an electric current flowing through a power line that connects a direct current power supply and a power conversion circuit;

generating a power spectrum from a signal of the detected electric current;

detecting a suspected electric arc based on a high-frequency component of the power spectrum;

determining, based on a low-frequency component of the power spectrum, whether a pseudo electric arc has been generated; and determining that there is an electric arc in response to a suspected electric arc being detected and a determination being made that a pseudo electric arc has not been generated, and determining that there is no electric arc in response to a suspected electric arc being detected and a determination being made that a pseudo electric arc has been generated.

* * * * *